United States Patent [19]

Harmon et al.

[11] Patent Number: 4,502,193
[45] Date of Patent: Mar. 5, 1985

[54] STAND-OFF FASTENER

[75] Inventors: Raymond E. Harmon, Tustin; Lloyd R. Poe, Long Beach, both of Calif.

[73] Assignee: Hartwell Corporation, Placentia, Calif.

[21] Appl. No.: 330,260

[22] Filed: Dec. 14, 1981

[51] Int. Cl.³ .............................................. A44B 21/00
[52] U.S. Cl. ......................................... 24/621; 24/297; 174/138 D; 411/208
[58] Field of Search ............... 24/213 R, 213 CS, 214, 24/224, 297, 211; 174/138 D; 411/24, 57, 41, 411/40, 32, 33, 44, 58, 208

[56] References Cited

U.S. PATENT DOCUMENTS

| | | | |
|---|---|---|---|
| 2,767,877 | 10/1956 | Newsom | 411/44 X |
| 3,568,263 | 3/1971 | Meehan | 24/297 X |
| 3,697,104 | 10/1972 | Soulie et al. | 24/211 X |
| 3,764,729 | 10/1973 | Kowalewski | 174/138 D |
| 3,811,154 | 5/1974 | Lindeman | 174/138 D |
| 3,852,849 | 12/1974 | Pestka | 174/138 D X |
| 3,918,130 | 11/1975 | Poe | 411/41 X |
| 4,007,516 | 2/1977 | Coules | 174/138 D X |
| 4,114,509 | 9/1978 | Poe | 24/214 X |
| 4,276,806 | 7/1981 | Morel | 411/41 |

FOREIGN PATENT DOCUMENTS

| | | |
|---|---|---|
| 542759 | 1/1942 | United Kingdom . |
| 1129250 | 10/1968 | United Kingdom . |
| 1147914 | 4/1969 | United Kingdom . |
| 1301516 | 12/1972 | United Kingdom . |

Primary Examiner—William E. Lyddane
Assistant Examiner—Peter A. Aschenbrenner
Attorney, Agent, or Firm—Lyon & Lyon

[57] ABSTRACT

A fastener for locking two objects in a predetermined relationship. The fastener has a fastener body including a spacer which defines a predetermined distance between the two objects. A first locking element is on one side of the spacer and a second locking element is on the other side of the spacer. The fastener body is adapted to receive a plunger which is adapted to travel from a retracted position to a secured position. The plunger causes the first and second locking elements to rigidly affix the objects to the fastener body thus holding the objects a predetermined distance from each other.

8 Claims, 3 Drawing Figures

U.S. Patent  Mar. 5, 1985  4,502,193
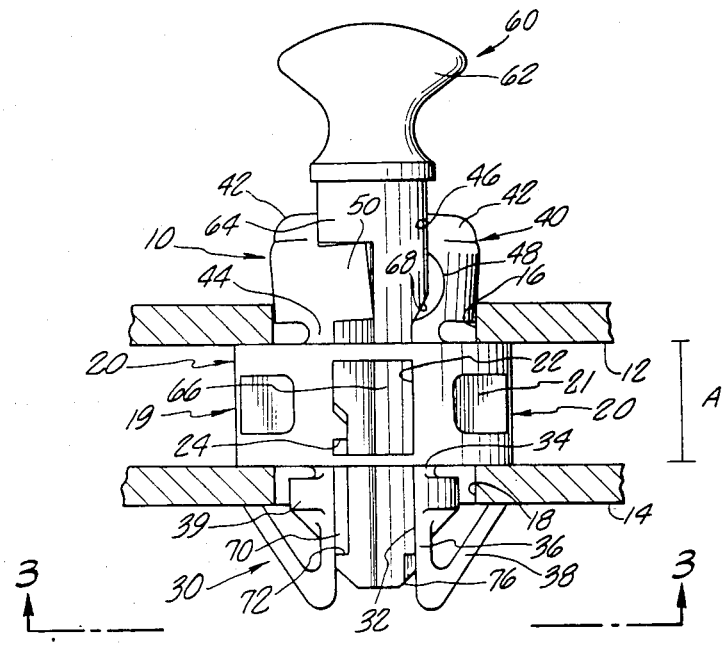
FIG. 1.
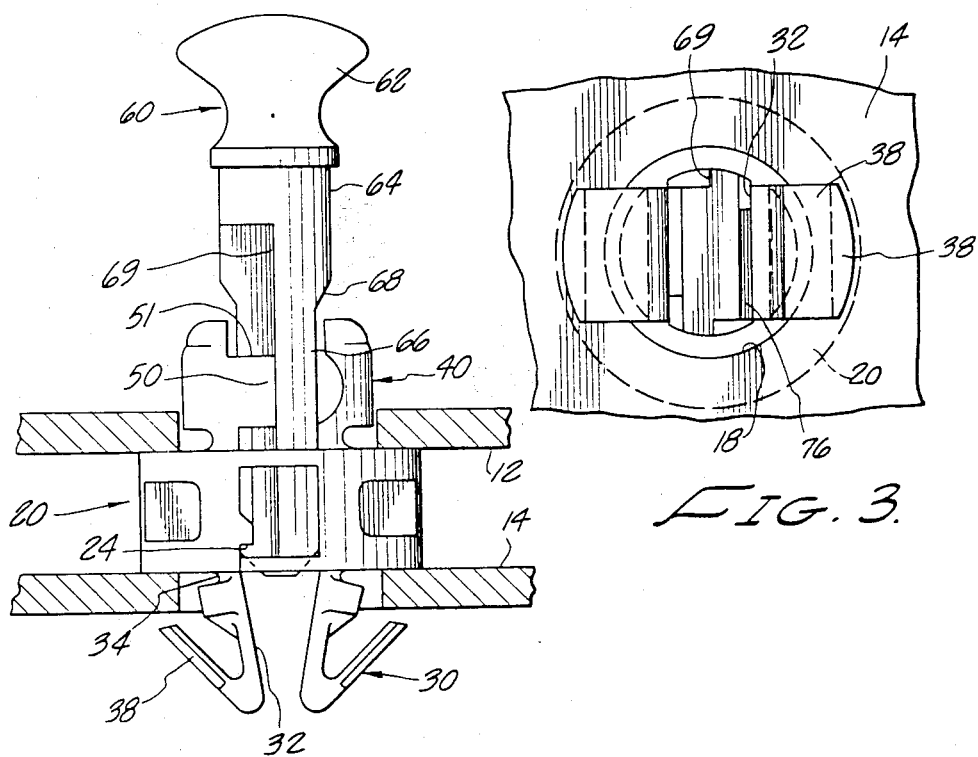
FIG. 2.
FIG. 3.

STAND-OFF FASTENER

BACKGROUND OF THE INVENTION

This application is directed toward fasteners and in particular those that are useful for selectively locking two objects to each other in a predetermined relationship.

For numerous reasons it is often useful to provide a mechanism which is able to lock two objects to each other in a fixed relationship and provide for a defined space between the objects. This is often desirable in electrical applications because of the possible conduction of electricity between the objects if the distance between them is not properly maintained.

In the case of circuit boards, it is usually necessary to mount those boards to a chassis having a plurality of specially designed mounts adapted to receive the boards. In other instances, it may be necessary to mount one board with respect to another board using such mounts. These boards are slid into the mounts, which have mechanisms for affixing the boards immovably to the chassis. These boards must be aligned precisely within the mounts or else oppositely positioned leads located on the boards and within the chassis will not be in contact and signal failures may result.

The boards are extremely fragile in their construction and thus not capable of careless or rough treatment. When mounting the boards in such a chassis, it is necessary to push the board into contact with the chassis mounts, often with considerably more force than should be appied to the board. Also, when removing the boards, it is often necessary to apply a considerable pulling force to the boards to unseat them from the chassis mounts.

Therefore, it is necessary that a fastener be developed which is able to lock a circuit board to a chassis or to another circuit board whereby a fixed relationship, including a defined distance exists between the circuit board and the chassis or another board in the locked state. It is further desirable that the fastener be easily opened to permit removal of a circuit board from the chassis or a first board to which it is mounted, yet designed so that the fastener remains affixed to the chassis or the first board for further use.

SUMMARY OF THE INVENTION

A fastener has been developed which solves the problems discussed hereinabove. The fastener has a fastener body with a plunger disposed therethrough and includes a base member or spacer and locking elements. On one side of the spacer and attached thereto is a first locking element, which is adapted to engage a member such as a chassis of the type normally used to seat circuit boards. The first locking element has a wall section and an outwardly extending tab section.

Attached to the other side of the spacer is a second locking element, which is adapted to engage a circuit board and thus retain the circuit board in a fixed relationship with respect to the chassis.

The plunger is sized so that a portion of it will fit through both locking elements. As the plunger is pushed toward the spacer, it will cause the first locking element to engage the chassis and the second locking element to engage the circuit board to affix them rigidly to each other. The spacer acts so that a defined distance exists between the board and chassis. By making the fastener of a non-conductive material, the two electrical components are thus insulated from each other.

By retracting the plunger, the locking elements are unlocked permitting the removal of the circuit board from the chassis by lifting the circuit board over the second locking element and plunger.

The first locking element acts to secure the fastener to the chassis. The unique design of the first locking element creates a free-float effect whereby the fastener is not rigidly affixed to the chassis when in the unlocked state, but rather permits radial float with respect to the chassis. This capability reduces the difficulty in seating the board properly with respect to the chassis when mounting or remounting of the board is desired.

In the preferred embodiment, the base member or spacer has a ridge extending partially into the channel through which the plunger travels. This ridge is operative to guide the plunger and define the maximum upward movement of the plunger when it is retracted with respect to the spacer. Thus, the plunger once pushed through the spacer will always remain captivated by the spacer. The present fastener also has means associated with the second locking element for limiting the maximum downward movement of the plunger.

DESCRIPTION OF THE DRAWINGS

FIG. 1 is a side perspective view illustrating the fastener of the present invention in a locked position.

FIG. 2 is a side perspective view illustrating the fastener of the present invention in a unlocked position.

FIG. 3 is a bottom view substantially along Section line 3—3 further illustrating the first locking element of the fastener of the present invention.

BRIEF DESCRIPTON OF THE PREFERRED EMBODIMENT

Turning to the Drawings, in FIG. 1 a side perspective view of the fastener of the present invention is shown. Briefly, the fastener, generally designated 10, is operative to affix an object such as a circuit board 12 to a chassis 14 or another circuit board (not shown) wherein a predetermined distance A is intended to exist between the board 12 and the chassis 14. The distance A is dependent upon the type of electrical circuit boards 12 that may be used. It should be noted that although the present specification will describe in detail one application of the present invention, the invention disclosed herein is useful for numerous other applications.

Circuit boards typically may have a plurality of apertures such as aperture 16 in board 12, extending entirely through their body. Similarly, a chassis 14 such as the type used in computers or other electronic equipment wherein circuit boards are to be mounted, also includes a plurality of apertures, such as aperture 18, defined therein.

A chassis 14 is normally constructed of metal, which may act as an electrical conductor. The circuit boards 12 are normally made of a non-conductive material, however, a plurality of raised logic lines contain conductive material which connect the various electronic components mounted on the boards. These boards 12 normally have a plurality of leads (not shown) at one end thereof which are aligned with leads (not shown) integral within the mounts of the chassis. When the boards are properly mounted within the chassis, the leads of both are aligned and in contact for electrical conduction.

The fastener 10 includes a fastener body, generally designated 19. An integral part of the fastener body 19 is a base member or spacer, generally designated 20, which is preferably made of a non-conductive material. For purposes of weight reduction the spacer 20 may have a plurality of voids 21 located therein. The fastener body 19 has an internal channel 22 substantially in the center, which runs entirely through the fastener body 19. A ridge 24 extends into the channel 22 from each side thereof.

Attached to one end of the spacer 20 and integral therewith is a first locking element, generally designated 30, which in the preferred embodiment consists of two oppositely positioned captivating tabs 32 which are pivotally attached to the spacer 20 at the recessed portions 34. These captivating tabs 32 have wall sections 36 which are integral with angled ribs 38 attached to the wall sections 36. The angled ribs 38 extend toward the spacer 20 and are capable of limited rotation with respect to the wall sections 36. The ribs 38 are connected to the wall sections 36 such that rotation away from the sections 36 is resisted.

In the preferred embodiment there are two captivating tabs 32, however, it should be apparent that additional captivating tabs of various configurations could be utilized. A protrusion 39 extends outwardly from each wall section 36 and is adapted to fit within the aperture 18 of the chassis 14. The size of the protrusions 39 will determine the range of movement or radial float of the first locking element 30 with respect to the chassis 14.

Attached to the other end of the spacer 20 and integral therewith is a second locking element, generally designated 40. The element 40 consists of oppositely positioned tabs 42 which are pivotally secured to the spacer 20 at pivots 44. The tabs 42 define an upper portion 46 of the channel 22 which has at its centermost portion a hollowed area 48 extending into each of the tabs 42. The hollowed area 48 provides for flexibility of the tabs 42 and may receive a detent (not shown) on the plunger to further secure the plunger in the locked position. Disposed into the upper portion channel 46 of the channel 22 from each of the tabs 42 is an aligning piece 50. The aligning pieces 50 include an upper surface 51 and may also act as a stop for the plunger when it is pushed downward in the channel 22.

A plunger, generally designed 60, is designed to fit into the channel 22. The plunger 60 has a head portion 62 which is attached to a first rod portion 64. The rod portion 64 is adapted to extend downwardly into the second locking element 40 and is integral with a second rod portion 66 which is of less width. Because of the difference in widths, a cam shoulder 68 is formed. Defined within each side of the plunger 60 is a guide recess 69. The guide recesses 69 are adapted to receive the aligning pieces 50 to maintain the plunger 60 in the proper position when moved axially within the channel 22.

On each side of the second rod portion 66 is a recess 70. The recesses 70 are adapted to receive the ridges 24 which guide the plunger 60 and captivate it with respect to the fastener body 19. At the lower end of each recess 70 is a surface 72 which engages the lower surface 78 of the ridges 24 when the plunger is retracted. At the lower end of the plunger 60 are chamfered surfaces 76 which facilitate downward movement of the plunger in the fastener body 19.

In FIG. 2 the fastener 10 is shown in the unlocked configuration. In this position, the tabs 32 of the first locking element 30 are biased inwardly and, thus, the angled ribs 38 do not contact the lower surface of the chassis 14.

When the fastener 10 is in the unlocked position, the first rod portion 64 is disposed outside of the second locking element 40, thus, the unbiased tabs 42 of the second locking element 40 are positioned normal to the plane of the circuit board 12. The aperture 16 in the board 12 has a diameter greater than the effective circumference of the second locking element 40, as defined by the outside surface of the tabs 42, when in the unlocked position. Thus, the board 12 may be moved axially with respect to the plunger 60 and the second locking element 40 to either mount or remove the board 12.

As the plunger 60 is retracted to unlock the board 12 from the chassis 14, the surfaces 72 of the recesses 70 come in contact with the inwardly extending bottom surfaces 78 of the ridges 24. Thus, the plunger 60 may not be totally retracted from the fastener body 19. The ridge 24 thus defines the maximum position that the plunger 60 may be retracted in the unlocked position.

Briefly, in FIG. 3, the position of the angled ribs 38 is shown with respect to the lower surface of the chassis 14 when the circuit board 12 is locked to the fastener 10. The ribs 38 are permitted limited pivotable movement toward the wall section 36 to permit the first locking element 30 to pass through the aperture 18 of the chassis 14.

To manufacture the fastener 10 of the present invention a mold is made which is capable of producing one complete fastener. In the molded state, the plunger 60 is integral with the uppermost portion of the second locking element 40, whereby a frangible connection exists. After the frangible connection has been severed, the plunger 60 may be inserted into the channel 22 of the fastener body 19.

To use the fastener 10 of the present invention, first locking element 30 of the molded fastener 10 is inserted into and through the aperture 18. When the plunger 60 is in the retracted position, as shown in FIG. 2, the circuit board 12 may be mounted by passing the plunger 60 and second locking element 40 through the aperture 16. As indicated previously, there may be a plurality of apertures 16 in the circuit board to permit the affixation of the board 12 at numerous locations. When the board 12 contacts the top of the spacer 20, the plunger 60 may be pushed into the channel 22 of the fastener body 19 for the purposes stated herein.

As the plunger 60 moves into the channel 22, the first rod portion 64 will cause outward movement of the tabs 42 until the tabs 42 contact the portion of the board 12 which forms the aperture 16. At this point, the board 12 will be rigidly affixed to the fastener 10. Simultaneous with the movement of the tabs 42 outward, the second rod portion 66 will cause the tabs 32 to move outwardly. In turn, this will cause the ends of the ribs 38 to engage the bottom surface of the chassis 14 thus clamping the fastener 10 to the chassis 14.

Although the present invention has been described in great detail herein, it should be apparent to those of ordinary skill in the art that various modifications could be made to the fastener 10 to perform in a similar manner, without departing from the spirit and scope of the following claims.

We claim:

1. A fastener for joining a first member at a first aperture therethrough in a fixed relationship to a second member at a second aperture therethrough, comprising
   a fastener body including a spacer, a first locking element on one side of said spacer, a second locking element on the other side of said spacer and a channel extending through said spacer, said first locking element and said second locking element, said first locking element having first movable tabs extending outwardly from said body at a distance from said spacer, said second locking element having second movable tabs defining a split body portion; and
   a plunger slidably extending into said channel, said plunger extending from said second locking element and being no larger than said split body portion in cross section, said plunger and said channel including surfaces for moving said tabs outwardly with advancement of said plunger.

2. The fastener of claim 1 wherein said first movable tabs are constructed and arranged to move toward said spacer upon advancement of said plunger.

3. The fastener of claim 1 wherein said second movable tabs are constructed and arranged to extend outwardly upon advancement of said plunger.

4. The fastener of claim 1 wherein said channel and said plunger include stop means for limiting movement of said plunger to prevent extraction from said fastener body.

5. The fastener of claim 1 wherein said first tabs extend both outwardly and toward said spacer to resist extraction.

6. The fastener of claim 1 wherein said surfaces include inclined surfaces wedging said tabs outwardly with advancement of said plunger.

7. A fastener for joining a first member at a first aperture therethrough in a fixed relationship to a second member at a second aperture therethrough, comprising
   a fastener body including a spacer, a first locking element on one side of said spacer, a second locking element on the other side of said spacer and a channel extending through said spacer, said first locking element and said second locking element, said first locking element having first movable tabs extending outwardly from said body at a distance from said spacer, said second locking element having second movable tabs defining a split body portion; and
   a plunger slidably extending into said channel, said plunger extending from said second locking element and being no larger than said split body portion in cross section, said plunger and said channel including surfaces for moving said tabs outwardly with advancement of said plunger, said first movable tabs being constructed and arranged to move toward said spacer upon advancement of said plunger, said second movable tabs being constructed and arranged to extend outwardly upon advancement of said plunger.

8. A fastener for joining a first member at a first aperture therethrough in a fixed relationship to a second member at a second aperture therethrough, the first aperture having a preselected length and cross section, comprising
   a fastener body including a spacer, a first locking element on one side of said spacer, a second locking element on the other side of said spacer and a channel extending through said spacer, said first locking element and said second locking element, said first locking element having first movable tabs including a first split body portion extending from said spacer and being smaller in cross section than the preselected cross section and ribs extending outwardly and toward said spacer, said ribs extending to a periphery larger than said preselected cross section, said second locking element having second movable tabs defining a second split body portion; and
   a plunger slidably extending into said channel, said plunger extending from said second locking element and being no larger than said second split body portion in cross section, said plunger and said channel including surfaces for moving said first tabs outwardly and toward said spacer with advancement of said plunger and further including surfaces for moving said second tabs outwardly with advancement of said plunger.

* * * * *